(12) United States Patent
Hammerschmidt et al.

(10) Patent No.: US 11,211,926 B2
(45) Date of Patent: Dec. 28, 2021

(54) SENSOR DEVICES AND METHODS FOR TRANSMITTING SENSOR DATA, APPARATUS AND METHOD FOR CONTROLLING A SENSOR DEVICE, APPARATUSES AND METHODS FOR DECODING A SENSOR SIGNAL

(71) Applicant: Infineon Technologies AG, Neubiberg (DE)

(72) Inventors: Dirk Hammerschmidt, Finkenstein (AT); Michael Strasser, Villach (AT)

(73) Assignee: Infineon Technologies AG, Neubiberg (DE)

( * ) Notice: Subject to any disclaimer, the term of this patent is extended or adjusted under 35 U.S.C. 154(b) by 658 days.

(21) Appl. No.: 15/883,153

(22) Filed: Jan. 30, 2018

(65) Prior Publication Data

US 2018/0226967 A1    Aug. 9, 2018

(30) Foreign Application Priority Data

Feb. 8, 2017   (DE) .......................... 102017102417.4

(51) Int. Cl.
| | |
|---|---|
| *H03K 17/687* | (2006.01) |
| *G08C 19/22* | (2006.01) |
| *G05B 21/02* | (2006.01) |
| *G01D 9/00* | (2006.01) |
| *G08C 19/28* | (2006.01) |

(52) U.S. Cl.
CPC ............ *H03K 17/687* (2013.01); *G01D 9/00* (2013.01); *G05B 21/02* (2013.01); *G08C 19/22* (2013.01); *G08C 19/28* (2013.01)

(58) Field of Classification Search
None
See application file for complete search history.

(56) References Cited

U.S. PATENT DOCUMENTS

| | | | | |
|---|---|---|---|---|
| 3,940,752 A | * | 2/1976 | Bair ..................... | A61B 5/0008 340/870.11 |
| 3,949,297 A | * | 4/1976 | Hideshima ............. | G08C 19/22 367/135 |
| 4,231,031 A | * | 10/1980 | Crowther ............... | G08C 19/28 340/12.16 |

(Continued)

FOREIGN PATENT DOCUMENTS

| | | |
|---|---|---|
| CN | 101167309 A | 4/2008 |
| CN | 103968861 A | 8/2014 |

(Continued)

*Primary Examiner* — Lina M Cordero
(74) *Attorney, Agent, or Firm* — Harrity & Harrity, LLP

(57) ABSTRACT

A sensor device includes an output driver configured to: adjust a first time interval of the output signal between a first signal edge of a first type and a first signal edge of a second type based on a first reference value; adjust a second time interval of the output signal between the first signal edge of the second type and a second signal edge of the first type based on a second reference value; adjust a third time interval of the output signal between the second signal edge of the first type and a second signal edge of the second type based on a first data value; and adjust a fourth time interval of the output signal between the second signal edge of the second type and a third signal edge of the first type based on a second data value.

25 Claims, 9 Drawing Sheets

(56) References Cited

U.S. PATENT DOCUMENTS

| | | | | |
|---|---|---|---|---|
| 4,251,812 A | * | 2/1981 | Okada | G08C 19/22 340/12.17 |
| 4,346,478 A | * | 8/1982 | Sichling | H04B 14/026 250/227.21 |
| 4,866,436 A | * | 9/1989 | Kordts | G08C 19/22 340/870.28 |
| 5,194,978 A | * | 3/1993 | Heep | G08C 19/28 340/12.11 |
| 2003/0128061 A1 | * | 7/2003 | Heyne | H03K 5/06 327/175 |
| 2005/0174271 A1 | * | 8/2005 | Carley | H03M 5/08 341/100 |
| 2015/0270994 A1 | * | 9/2015 | Scherr | H04L 25/4902 375/238 |
| 2016/0050089 A1 | * | 2/2016 | Strasser | H04L 25/4902 375/238 |
| 2016/0094370 A1 | * | 3/2016 | Rasbornig | H04L 1/005 375/238 |

FOREIGN PATENT DOCUMENTS

| | | |
|---|---|---|
| CN | 104122820 A | 10/2014 |
| CN | 105005208 A | 10/2015 |
| JP | 2000261381 A | 9/2000 |
| JP | 2015184955 A | 10/2015 |

\* cited by examiner

SENSOR DEVICES AND METHODS FOR TRANSMITTING SENSOR DATA, APPARATUS AND METHOD FOR CONTROLLING A SENSOR DEVICE, APPARATUSES AND METHODS FOR DECODING A SENSOR SIGNAL

RELATED APPLICATION

This application claims priority under 35 U.S.C. § 119 to German Patent Application No. 102017102417.4, filed on Feb. 8, 2017, the contents of which are incorporated by reference herein in their entirety.

TECHNICAL FIELD

Examples relate to sensor communication. In particular, examples relate to sensor devices and methods for transmitting sensor data, an apparatus and a method for controlling a sensor device, and apparatuses and methods for decoding a sensor signal.

BACKGROUND

Communication between a sensor and a sensor controller (e.g. an Electronic Control Unit, ECU) may, e.g., be based on the Single Edge Nibble Transmission (SENT) protocol, or the Short Pulse-width modulation Code (SPC) protocol. Both protocols use the time between falling edges of the communication signal in order to encode data. The time between the falling edges is between 12 and 27 clock ticks. A data rate of SENT or SPC communication between the sensor and the sensor controller is therefore limited.

Hence, there may be a demand for data communication between a sensor and another entity with increased data rate.

SUMMARY

Such a demand may be satisfied by examples described herein.

An example relates to sensor device for transmitting sensor data. The sensor device comprises an output driver configured to generate an output signal of the sensor device. The output driver is configured to adjust a first time interval of the output signal between a first signal edge of a first type and a first signal edge of a second type based on a first reference value. Further, the output driver is configured to adjust a second time interval of the output signal between the first signal edge of the second type and a second signal edge of the first type based on a second reference value. The output driver is additionally configured to adjust a third time interval of the output signal between the second signal edge of the first type and a second signal edge of the second type based on a first data value. Further, the output driver is configured to adjust a fourth time interval of the output signal between the second signal edge of the second type and a third signal edge of the first type based on a second data value.

Another example relates to a further sensor device for transmitting sensor data. The sensor device is configured to receive a control signal. The sensor device comprises an output driver configured to generate an output signal of the sensor device in response to the control signal. The output driver is configured to adjust a first time interval of the output signal between a first signal edge of a first type and a first signal edge of a second type based on a first data value. Further, the output driver is configured to adjust a second time interval of the output signal between the first signal edge of the second type and a second signal edge of the first type based on a second data value.

An example relates to an apparatus for controlling a sensor device. The apparatus comprises an output driver configured to generate a control signal for the sensor device. The output driver is configured to adjust a first time interval of the control signal between a first signal edge of a first type and a first signal edge of a second type based on a first reference value. Further, the output driver is configured to adjust a second time interval of the control signal between the first signal edge of the second type and a second signal edge of the first type based on a second reference value. The output driver is additionally configured to adjust a third time interval of the control signal between the second signal edge of the first type and a second signal edge of the second type based on a first control value.

A further example relates to an apparatus for decoding a sensor signal that comprises sensor data. The apparatus comprises processing circuitry configured to calculate a unit time based on a first time interval of the sensor signal between a first signal edge of a first type and a second signal edge of the first type, and information about a first and a second reference value represented by the first time interval. Further, the processing circuitry is configured to calculate a first data value based on information about the second reference value and a ratio of the unit time to a third time interval of the sensor signal between a first signal edge of a second type and a second signal edge of the second type. The second reference value is represented by a second time interval of the sensor signal between the first signal edge of the second type and the second signal edge of the first type.

Another example relates to a further apparatus for decoding a sensor signal that comprises sensor data. The apparatus comprises processing circuitry configured to calculate a unit time based on a first time interval of the sensor signal between a first signal edge of a first type and a first signal edge of a second type, a second time interval of the sensor signal between the first signal edge of the second type and a second signal edge of the first type, and information about a first and a second reference value represented by the first and the second time interval. Further, the processing circuitry is configured to calculate a compensation time based on a time difference between the first time interval and the second time interval, and a multiple of the unit time that is proportional to a difference between the first and the second reference value. The processing circuitry is additionally configured to calculate a first data value based on the unit time, and a difference between the compensation time and a third time interval of the sensor signal between the second signal edge of the first type and a second signal edge of the second type.

An example relates to a still further apparatus for decoding a sensor signal that comprises sensor data. The apparatus comprises processing circuitry configured to calculate a first data value based on information about a reference value and a ratio of a unit time to a first time interval of the sensor signal between a first signal edge of a first type and a second signal edge of the first type. The unit time is related to a time base of the apparatus. The reference value is represented by a leading time interval of the sensor signal between the first signal edge of the first type and a first signal edge of a second type.

A further example relates to method for transmitting sensor data of a sensor device. The method comprises generating an output signal of the sensor device. Generating the output signal of the sensor device comprises adjusting a first time interval of the output signal between a first signal edge of a first type and a first signal edge of a second type based on a first reference value. Further, generating the output signal of the sensor device comprises adjusting a second time interval of the output signal between the first signal edge of the second type and a second signal edge of the first type based on a second reference value. Generating the output signal of the sensor device additionally comprises adjusting a third time interval of the output signal between the second signal edge of the first type and a second signal edge of the second type based on a first data value. Further, generating the output signal of the sensor device comprises adjusting a fourth time interval of the output signal between the second signal edge of the second type and a third signal edge of the first type based on a second data value.

Another example relates to a further method for transmitting sensor data of a sensor device. The method comprises receiving a control signal. Further the method comprises generating an output signal of the sensor device in response to the control signal. Generating the output signal of the sensor device comprises adjusting a first time interval of the output signal between a first signal edge of a first type and a first signal edge of a second type based on a first data value. Further, generating the output signal of the sensor device comprises adjusting a second time interval of the output signal between the first signal edge of the second type and a second signal edge of the first type based on a second data value.

An example relates to a method for controlling a sensor device. The method comprises generating a control signal for the sensor device. Generating the control signal for the sensor device comprises adjusting a first time interval of the control signal between a first signal edge of a first type and a first signal edge of a second type based on a first reference value. Further, generating the control signal for the sensor device comprises adjusting a second time interval of the control signal between the first signal edge of the second type and a second signal edge of the first type based on a second reference value. Generating the control signal for the sensor device additionally comprises adjusting a third time interval of the control signal between the second signal edge of the first type and a second signal edge of the second type based on a first control value.

A further example relates to a method for decoding a sensor signal that comprises sensor data. The method comprises calculating a unit time based on a first time interval of the sensor signal between a between a first signal edge of a first type and a second signal edge of the first type, and information about a first and a second reference value represented by the first time interval. Further, the method comprises calculating a first data value based on information about the second reference value and a ratio of the unit time to a third time interval of the sensor signal between a first signal edge of a second type and a second signal edge of the second type. The second reference value is represented by a second time interval of the sensor signal between a between the first signal edge of the second type and the second signal edge of the first type.

Another example relates to a further method for decoding a sensor signal that comprises sensor data. The method comprises calculating a unit time based on a first time interval of the sensor signal between a first signal edge of a first type and a first signal edge of a second type, a second time interval of the sensor signal between a between the first signal edge of the second type and a second signal edge of the first type, and information about a first and a second reference value represented by the first and the second time interval. Further, the method comprises calculating a compensation time based on a time difference between the first time interval and the second time interval, and a multiple of the unit time that is proportional to a difference between the first and the second reference value. The method additionally comprises calculating a first data value based on the unit time, and a difference between the compensation time and a third time interval of the sensor signal between the second signal edge of the first type and a second signal edge of the second type.

An example relates to a still further method for decoding a sensor signal that comprises sensor data. The method comprises calculating a first data value based on information about a reference value and a ratio of a unit time to a first time interval of the sensor signal between a first signal edge of a first type and a second signal edge of the first type. The unit time is related to a predefined time base. The reference value is represented by a leading time interval of the sensor signal between the first signal edge of the first type and a first signal edge of a second type.

A further example relates to a sensor system comprising at least one of the above sensor devices, the above apparatus for controlling a sensor device, and the above apparatuses for decoding a sensor signal.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
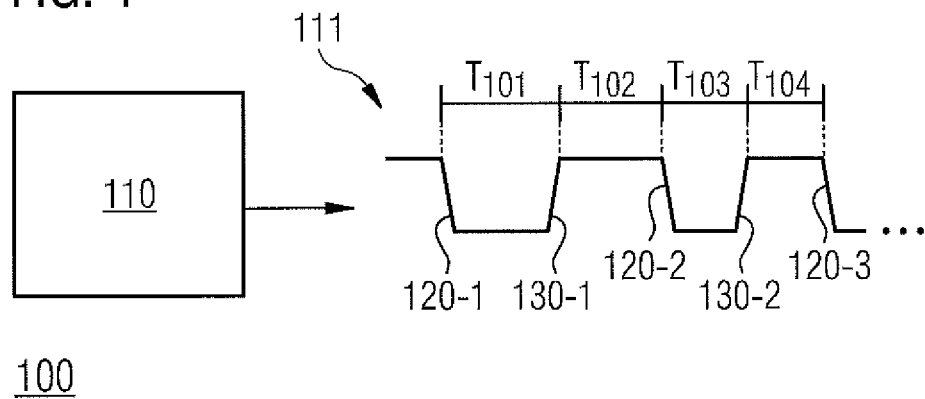
FIG. 1 illustrates an example of sensor device.

FIG. 1 illustrates a sensor device 100 for transmitting sensor data. The sensor device 100 comprises an output driver 110 configured to generate an output signal 111 of the sensor device 100. The output driver 110 is configured to adjust a first time interval $T_{101}$ of the output signal 111 between a first signal edge 120-1 of a first type and a first signal edge 130-1 of a second type based on a first reference value. Further, the output driver 110 is configured to adjust a second time interval $T_{102}$ of the output signal 111 between the first signal edge 130-1 of the second type and a second signal edge 120-2 of the first type based on a second reference value. The output driver 110 is additionally configured to adjust a third time interval $T_{103}$ of the output signal 111 between the second signal edge 120-2 of the first type and a second signal edge 130-2 of the second type based on a first data value (of the sensor data). Further, the output driver 110 is configured to adjust a fourth time interval $T_{104}$ of the output signal 111 between the second signal edge 130-2 of the second type and a third signal edge 120-3 of the first type based on a second data value (of the sensor data).

The sensor device 100 encodes the sensor data in the low times (e.g. third time interval $T_{103}$) as well as the high times (e.g. fourth time interval $T_{104}$) of the output signal 111. Accordingly, a data rate of the output signal 111 may be increased.

For example, the lengths of the first to fourth time intervals $T_{101}$ to $T_{104}$ are adjusted according to the value represented by the first reference value, the second reference value, the first data value or the second data value, respectively. Accordingly, a respective time interval between subsequent signal edges of the output signal 111 may represent a certain value. For example, a time interval between succeeding signal edges of the output signal 111 may be short for representing a small value (e.g. small reference value or small data value), whereas a time interval between succeeding signal edges of the output signal 111 may be long for representing a high value (e.g. high reference value or high data value).

The first and second reference values are values known to the sensor device 100 and a subsequent data decoding stage. For example, the first reference value may be equal to the second reference value. Alternatively, the first reference value may be different from the second reference value. The first and second reference values may, e.g., be integer values.

Since the first and second time intervals $T_{101}$ and $T_{102}$ of the output signal 111 are based on the first and second reference values, subsequent data decoding (e.g. by a receiver of the output signal 111) may further be insensitive to asymmetries of the output driver 110. For example, the output driver 110 may be a push-pull driver. A push-pull driver may generally suffer from asymmetries between its nMOS (n-channel Metal-Oxide-Semiconductor) path and its pMOS (p-channel MOS) path which may cause differences between the rise time and the fall time of the output signal 111 (e.g. signal edges of the first type and signal edges of the second type may have a different slope). The encoding of the first and second reference values in the first and second time intervals $T_{101}$ and $T_{102}$ of the output signal 111 may allow a subsequent decoding stage to compensate for this asymmetries (e.g. see FIGS. 4, 5 and 7 to 9).

As indicated in FIG. 1, signal edges of the first type may be falling signal edges, and signal edges of the second type may be rising signal edges. However, in some examples, signal edges of the first type may alternatively be rising signal edges, while signal edges of the second type may be falling signal edges.

The output signal 111 may additionally comprise further time intervals between succeeding signal edges of the first type and signal edges of the second type. The further time intervals may represent further sensor data.

In some examples, the last time interval of the output signal 111 (not illustrated) between the last signal edge of the first type and the last signal edge of the second type may be shorter than a shortest possible time interval for representing a data value (of the sensor data). The last time interval may indicate for a receiver of the output signal 111 that the transmission of the sensor data is complete. For example, if the sensor device 100 and a receiver of the output signal 111 are communicating bidirectionally via, e.g., a wire or a bus, the last time interval may indicate completion of the transmission from the sensor device 100 to the receiver.

The output driver 110 may further be configured to set a communication node (not illustrated) of the sensor device 100 to a high ohmic state, when the output driver 110 is not supplying the output signal 111 to the communication node. For example, the sensor device 100 may comprise a single communication node for communicating with other entities (e.g. a receiver of the output signal 111). Setting the communication node to the high ohmic state may allow to use the sensor device 100 in a bus system, and may allow bidirectional communication with the sensor device 100.

Figure 3:
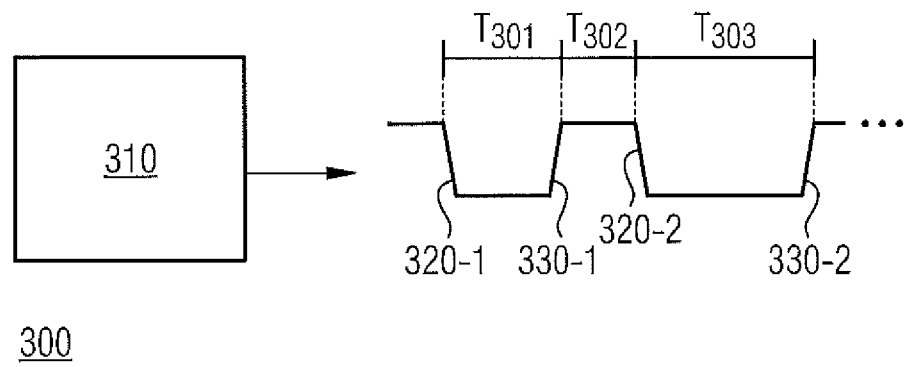
FIG. 3 illustrates an example of an apparatus for controlling a sensor device.

In some examples, the sensor device 100 may further be configured to receive a control signal (e.g. via the single communication node of the sensor device 100). The output driver 110 may be configured to generate the output signal 111 in response to the control signal. For example, the control signal may be received from an apparatus for controlling the sensor device (e.g. as illustrated in FIG. 3). That is, the sensor device 100 may be triggered by the control signal to transmit its sensor data. For example, in a bidirectional communication system or a bus system, an apparatus for controlling the sensor device may actively trigger the sensor device 100 to transmit its sensor data.

In order to make sure that a control value (control command) was correctly received by the sensor device 100, the sensor device 100 may further comprise a processing circuitry (not illustrated) configured to calculate a checksum for the control signal. The output driver 110 may be further configured to adjust, based on the checksum, a time interval of the output signal 111 between succeeding signal edges of different types. Alternatively, the processing circuitry may calculate one or more other quantities indicative of the data in the control signal, and the output driver 110 may be configured to adjust, based on the one or more other quantities, one or more time intervals of the output signal 111 between succeeding signal edges of different types.

The sensor device 100 may, e.g., be configured to synchronize its data acquisition (e.g. the capturing of data points) based on a predefined signal edge of the control signal. For example, the sensor device may synchronize its data acquisition to the first signal edge of the control signal, or the last signal edge of the control signal.

Figure 2:
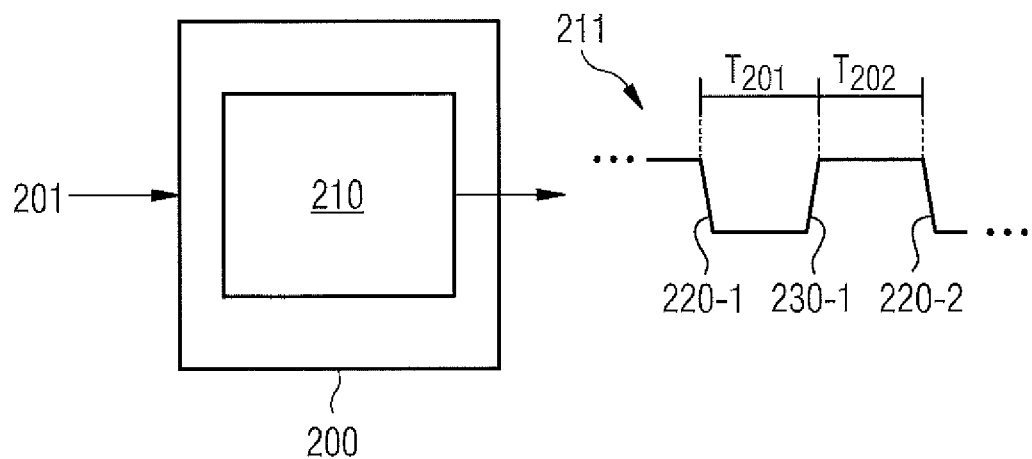
FIG. 2 illustrates another example of a sensor device.

A further sensor device 200 for transmitting sensor data is illustrated in FIG. 2. The sensor device 200 is configured to receive a control signal 201. The sensor device 200 comprises an output driver 210 configured to generate an output signal 211 of the sensor device 200 in response to the control signal 201. The output driver 210 is configured to adjust a first time interval $T_{201}$ of the output signal 211 between a first signal edge 220-1 of a first type and a first signal edge 230-1 of a second type based on a first data value (of the sensor data). Further, the output driver 210 is configured to adjust a second time interval $T_{202}$ of the output signal 211 between the first signal edge 230-1 of the second type and a second signal edge 220-2 of the first type based on a second data value (of the sensor data).

The sensor device may allow for bidirectional communication, or may be used in a bus system. Since the sensor device 200 encodes the sensor data in the low times (e.g. first time interval $T_{201}$) as well as the high times (e.g. second time interval $T_{202}$) of the output signal 211, a data rate of the output signal 211 may be increased.

As indicated in FIG. 2, signal edges of the first type may be falling signal edges, and signal edges of the second type may be rising signal edges. However, in some examples, signal edges of the first type may alternatively be rising signal edges, while signal edges of the second type may be falling signal edges.

The output signal 211 may additionally comprise further time intervals between succeeding signal edges of the first type and signal edges of the second. The further time intervals may represent further sensor data.

The control signal 201 may, e.g., be received from an apparatus for controlling a sensor device (e.g. as illustrated in FIG. 3). The control signal 201 may comprise one or more control values (control commands) for the sensor device 200. Additionally, the control signal 201 may comprise further data (e.g. reference values).

The output driver 210 may further be configured to set a communication node (not illustrated) of the sensor device 200 to a high ohmic state, when the output driver 210 is not supplying the output signal 211 to the communication node. For example, the sensor device 200 may comprise a single communication node for communicating with other entities (e.g. a supplier of the control signal 201, or a receiver of the output signal 211). Setting the communication node to the high ohmic state may allow to set the sensor device 200 to a receive state in a bus system, or a bidirectional communication system.

In some examples, a processing circuitry (not illustrated) of the sensor device 200 may be configured to calculate a time base for the sensor device 200 based on the control signal 201. The time base is a period of time used as reference for processes executed by the sensor device 200. In other words, the time base may be understood as a fundamental clock for the processes in the sensor device 200. For example, the output driver 210 may be configured to generate the output signal 211 based on the time base. The output driver 210 may, e.g., generate a time interval of the output signal between succeeding edges of different types as a multiple of the time basis. For example, the time interval may be an integer multiple of the time basis, wherein the integer is proportional to, e.g., a data value of the sensor data or a reference value. Calculating the time base may allow the sensor device 200 to adjust its time base to the time base of the control signal 201's supplier. This may allow to generate the output signal 211 with a minimum number of signal edges leading the first signal edge 220-1.

For example, the output driver 210 may be configured to adjust a leading time interval of the output signal between a second signal edge of the second type (not illustrated) and the first signal edge 220-1 of the first type based on a reference value. In other words, the first time interval is succeeding the leading time interval. For example, the leading time interval may be shorter than a shortest possible time interval for representing a data value. If a decoding stage (receiving the output signal 211) uses the same time base as the supplier of the control signal 201, the adjustment of the sensor device 200's time base to the time base of the supplier of the control signal 201 and the encoding of the reference value in the leading time interval may allow the decoding stage to decode the output signal 211 (e.g. see FIGS. 6 and 13). Since only one time interval is encoded with the reference value, a payload of the output signal 211 may be increased. For example, the output signal 211 may comprise more sensor data per unit time.

In order to make sure that a control value (control command) was correctly received by the sensor device 200, the processing circuitry of sensor device 200 may be configured to calculate a checksum for the control signal 201. The output driver 210 may be further configured to adjust, based on the checksum, a time interval of the output signal 211 between succeeding signal edges of different types. For example, a high security Cyclic Redundancy Check (CRC; e.g. CRC8 or CRC16) may be used, since errors may appear if the adjustment of the sensor device 200's time base is inaccurate. Alternatively, the processing circuitry may calculate one or more other quantities indicative of the data in the control signal 201, and the output driver 210 may be configured to adjust, based on the one or more other quantities, one or more time intervals of the output signal 211 between succeeding signal edges of different types.

Alternatively, the output driver 210 may be further configured to adjust a third time interval of the output signal 211 between a third signal edge of the first type and a second signal edge of the second type based on a first reference value. Further, the output driver 210 may be configured to adjust a fourth time interval of the output signal 211 between the second signal edge of the second type and the first signal edge 220-1 of the first type based on a second reference value. In other words, the third and the fourth time interval are leading the first time interval $T_{201}$.

If the output driver 210 is a push-pull driver, adjusting the third and fourth time intervals based on the first and second reference values may allow a subsequent data decoding stage (e.g. receiver of the output signal 211) to be insensitive to asymmetries of the output driver 210. The encoding of the first and second reference values in the third and fourth time intervals of the output signal 211 may allow a subsequent decoding stage to compensate for this asymmetries (e.g. see FIGS. 4, 5 and 7 to 9).

In further alternative examples, the processing circuitry of the sensor device 200 may be configured to calculate a first control value for the sensor device 200 and a second control value for the sensor device 200 based on the control signal 201. In other words, the processing circuitry may decode the control signal 201 in order to determine control values for the sensor device 200. The output driver 210 may be further configured to adjust a third time interval of the output signal 211 between a third signal edge of the first type and a second signal edge of the second type based on the (decoded) first control value. Further, the output driver 210 may be configured to further adjust a fourth time interval of the output signal 211 between the second signal edge of the second type and the first signal edge 220-1 of the first type based on the (decoded) second control value. In other words, the third time interval and the fourth time interval of the output signal 211 may be based on the decoded control values for the sensor device 200. That is, the sensor device 200 may decode the control signal 201 and re-encode the received data into its output signal 211 instead of the first and second reference values. This may implement an additional safety mechanism since the receiver of the output signal 211 (knowing the first and second control values) may verify if the control signal 201 was correctly received by the sensor device 200.

In some examples, if one of the first control value and the second control indicates an address of the sensor device 200, the output driver 210 may be configured to adjust the corresponding one of the third time interval of the output signal and the fourth time interval of the output signal 211 based on the address of the sensor device 200 that is hard-coded in the sensor device 200. This may allow to verify if the sensor device 200 is really the sensor device that was requested by the supplier of the control signal 201.

In some examples, the last time interval of the output signal 211 (not illustrated) between the last signal edge of the first type and the last signal edge of the second type may be shorter than a shortest possible time interval for representing a data value (of the sensor data). The last time interval may indicate for a receiver of the output signal 211 that the transmission of the sensor data is complete.

Alternatively, a fixed time frame for the communication between the sensor device 200 and a third entity may be chosen. That is, the combined timely length of the control signal 201 and the output signal 211 is predetermined. Accordingly, the output driver 210 may maintain the output signal 211 in the high or low level (as determined by the last signal edge used for transmitting sensor data) until the time frame elapses.

The sensor device 200 may, e.g., be configured to synchronize its data acquisition (e.g. the capturing of data points) based on a predefined signal edge of the control signal 201. For example, the sensor device 200 may synchronize its data acquisition to the first signal edge of the control signal 201, or the last signal edge of the control signal 201.

With reference to FIG. 3, an apparatus 300 for controlling a sensor device (not illustrated) is described in the following. The apparatus 300 comprises an output driver 310 configured to generate a control signal 311 for the sensor device. The output driver 310 is configured to adjust a first time interval $T_{301}$ of the control signal 311 between a first signal edge 320-1 of a first type and a first signal edge 330-1 of a second type based on a first reference value. Further, the output driver 310 is configured to adjust a second time interval $T_{302}$ of the control signal 311 between the first signal edge 330-1 of the second type and a second signal edge 320-2 of the first type based on a second reference value. The output driver 310 is additionally configured to adjust a third time interval $T_{303}$ of the control signal 311 between the second signal edge 320-2 of the first type and a second signal edge 330-2 of the second type based on a first control value.

Since the apparatus 300 encodes the data in the low times (e.g. first time interval $T_{301}$ or third time interval $T_{303}$) as well as the high times (e.g. second time interval $T_{302}$) of the control signal 311, a data rate of the control signal 311 for the sensor device may be increased.

The first and second reference values are values known to the apparatus 300 and the sensor device receiving the control signal 311 (e.g. a sensor device as illustrated in FIG. 1 or FIG. 2). For example, the first reference value may be equal to the second reference value. Alternatively, the first reference value may be different from the second reference value. The first and second control value may, e.g., be integer values.

The control value is a value that indicates a certain command for the sensor device. For example, the first control value may designate an address (identity) of the sensor device in order to indicate the intended receiver of the control signal 311, whereas the second control value may be a command for the sensor device to transmit its sensor data.

If the output driver 310 is a push-pull driver, adjusting the first and second time intervals $T_{301}$ and $T_{302}$ based on the first and second reference values may further allow the sensor device to be insensitive to asymmetries of the output driver 310. The encoding of the first and second reference values in the first and second time intervals $T_{301}$ and $T_{302}$ of the output signal 211 may allow the sensor to compensate for this asymmetries (similar to the compensation in sensor signals described in connection with e.g. FIGS. 4, 5 and 7 to 9).

As indicated in FIG. 3, signal edges of the first type may be falling signal edges, and signal edges of the second type are rising signal edges. However, in some examples, signal edges of the first type may alternatively be rising signal edges, while signal edges of the second type are falling signal edges.

The control signal 311 may additionally comprise further time intervals between succeeding signal edges of the first type and signal edges of the second. The further time intervals may represent further control values (control data). For example, the output driver 310 may be further configured to adjust a fourth time interval of the control signal 311 between the second signal edge 330-2 of the second type and a third signal edge of the first type based on a second control value.

In some examples, the output driver 310 may be configured to adjust the last time interval of the control signal 311 between the last signal edge of the first type and the last signal edge of the second type to be shorter than a shortest possible time interval for representing a control value. The last time interval may indicate to the sensor device that the transmission of the control data is complete.

The apparatus 300 may be further configured to receive a sensor signal (not illustrated) from the sensor device. The sensor signal comprises information about a first decoded control value and a second decoded control value. The decoded first control value and the decoded second control value are calculated by the sensor device from the control signal 311. For example, a first time interval of the sensor signal between a first signal edge of a first type and a second signal edge of a second type may be adjusted based on the decoded first control value and a second time interval of the sensor signal between the first signal edge of the second type and a second signal edge of the first type may be adjusted based on the decoded second control value. By comparing the decoded first control value and/or the decoded second control value to the first control value and the second control value, the apparatus 300 may verify, if the control signal 311 was correctly received by the sensor device.

Further, the apparatus 300 may be further configured to receive a sensor signal (not illustrated) from the sensor device that comprises information about an address of the sensor device that is hard-coded in the sensor device. For example, a time interval of the sensor signal between succeeding signal edges may be adjusted based on the address of the sensor device that is hard-coded in the sensor device. If the first control value indicates an address of the sensor device, the apparatus 300 may verify, if the control signal 311 was received by the intended sensor device, by comparing the first control value to the information about the address of the sensor device that is hard-coded in the sensor device.

In the following various apparatuses for decoding sensor signals are described in connection with FIGS. 4 to 6.

Figure 4:
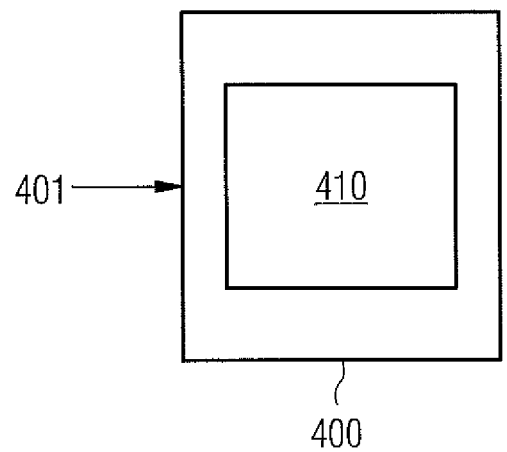
FIG. 4 illustrates an example of an apparatus for decoding a sensor signal.

FIG. 4 illustrates an apparatus 400 for decoding a sensor signal 401 that comprises sensor data. The apparatus 400 comprises processing circuitry 410 configured to calculate a unit time based on a first time interval of the sensor signal 401 between a between a first signal edge of a first type and a second signal edge of the first type, and information about a first and a second reference value represented by the first time interval. Further, the processing circuitry 410 is configured to calculate a first data value based on information about the second reference value and a ratio of the unit time to a third time interval of the sensor signal 401 between a first signal edge of a second type and a second signal edge of the second type. The second reference value is represented by a second time interval of the sensor signal 401 between the first signal edge of the second type and the second signal edge of the first type.

The apparatus 400 may allow to decode sensor signals of high data rate. Moreover, the apparatus 400 may be insensitive to asymmetries of a sensor device's output driver. For example, the apparatus may allow to correctly encode the sensor signal 401 if the rise time and the fall time of the sensor signal 401 differ (e.g. signal edges of a first type and signal edges of a second type may have a different slope).

Figure 7:
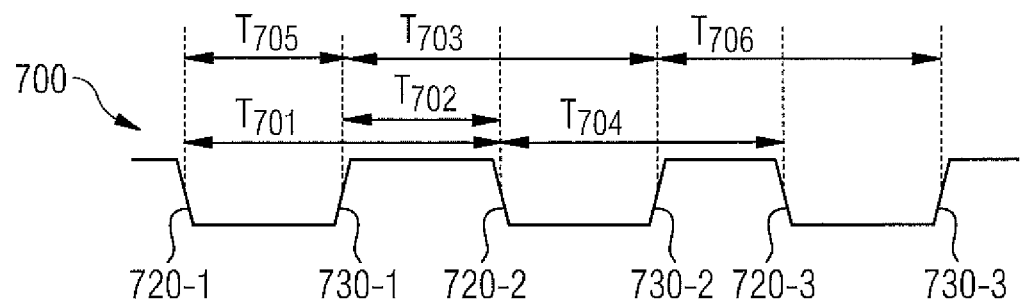
FIG. 7 illustrates an example of a sensor signal.

Details of the decoding process that is executed by the processing circuitry 410 are described in the following with reference to FIGS. 7 and 8. FIG. 7 illustrates a sensor signal 700 that may be decoded by the apparatus 400. In other words, sensor signal 700 may be an example for the sensor signal 401. For example, the sensor device 100 illustrated in FIG. 1, or the sensor device 200 illustrated in FIG. 2 may generate the sensor signal 700.

The sensor signal 700 comprises a first time interval $T_{701}$ between a between a first signal edge 720-1 of a first type (e.g. falling signal edge) and a second signal edge 720-2 of the first type. Further, the sensor signal 700 comprises a second time interval $T_{702}$ between a first signal edge 730-1 of a second type (e.g. rising signal edge) and the second signal edge 720-2 of the first type. The sensor signal 700 further comprises a third time interval $T_{703}$ between the first signal edge 730-1 of the second type and a second signal edge 730-2 of the second type. The sensor signal 700 also comprises a fourth time interval $T_{704}$ between the second signal edge 720-2 of the first type and a third signal edge 720-3 of the first type. The sensor signal 700 comprises a fifth time interval $T_{705}$ between the first signal edge 720-1 of the first type and the first signal edge 730-1 of the second type.

A first reference value $R_1$ and a second reference value $R_2$ are represented by the first time interval $T_{701}$. In particular, the second reference value $R_2$ is represented by the second time interval $T_{702}$, and the first reference value $R_1$ is represented by the fifth time interval $T_{705}$. The first reference value $R_1$ and the second reference value $R_2$ are known to the sensor device as well as the apparatus 400. For example, the first reference value $R_1$ and/or the second reference value $R_2$ may represent reference integers. Alternatively, the first reference value $R_1$ and/or the second reference value $R_2$ may represent control values of a control signal received by the sensor device (e.g. an address of the sensor, or a command for the sensor device). Further alternatively, the first reference value $R_1$ and/or the second reference value $R_2$ may represent a checksum for a control signal that is received by the sensor device.

The processing circuitry 410 of the apparatus 400 is configured to calculate a unit time based on the first time interval $T_{701}$ and information about the first and a second reference values $R_1$ and $R_2$. The unit time is the basic period length for calculating the length of a time period of the sensor signal 700. In other words, time periods of the sensor signal 700 are calculated as multiples of the unit time. The known reference values $R_1$ and $R_2$ allow to calculate the unit time from the first time interval $T_{701}$.

For example, the processing circuitry 410 may be configured to calculate the unit time based on an expression which is mathematically correspondent to $$T_U = \frac{T_{701}}{R_1 + R_2}, \qquad (1)$$

with $T_U$ denoting the unit time.

The processing circuitry 410 is further configured to calculate a first data value of the sensor data based on the information about the second reference value $R_2$ and a ratio of the unit time $T_U$ to the third time interval $T_{703}$.

For example, the processing circuitry 410 may be configured to calculate the first data value based on an expression which is mathematically correspondent to $$D_1 = \frac{T_{703}}{T_U} - R_2, \qquad (2)$$

with $D_1$ denoting the first data value.

The processing circuitry 410 may be further configured to calculate a second data value of the sensor data based on information on the first data value $D_1$ and a ratio of the unit time $T_U$ to the fourth time interval $T_{704}$.

For example, the processing circuitry 410 may be configured to calculate the second data value based on an expression which is mathematically correspondent to $$D_2 = \frac{T_{704}}{T_U} - D_1, \quad (3)$$

with $D_2$ denoting the first data value.

Similarly, the processing circuitry 410 may be configured to calculate further data values of the sensor data based on information on an immediately preceding data value and a ratio of the unit time $T_U$ to a time interval representing the further data value and the immediately preceding data value.

For example, the processing circuitry 410 may be configured to calculate a third data value based on an expression which is mathematically correspondent to $$D_3 = \frac{T_{706}}{T_U} - D_2, \quad (4)$$

with $D_3$ denoting the first data value, and $T_{706}$ denoting a sixth time interval between the second signal edge 730-2 of the second type and a third signal edge 730-3 of the second type.

For example, sensor signal 700 may be a PWM signal. One data nibble in each high or low phase of the PWM signal may be encoded without a restriction of the length of the low time to the existing SENT or SPC protocol. This may further avoid to introduce timing inaccuracies that are generated by differences of the rising and falling edges or by the inaccuracy of the decoding threshold in order to achieve the highest possible data rate for a given Bit Error Rate (BER). As illustrated in FIG. 8, this decoding scheme may make the data reception insensitive to asymmetries in the pMOS and nMOS path of a sensor device's output driver which may cause differences between the rise time and the fall time. If the proposed decoding is used, the only effect is a shift of the rise-to-rise time period against the fall-to-fall time period by a constant offset.

Figure 8:
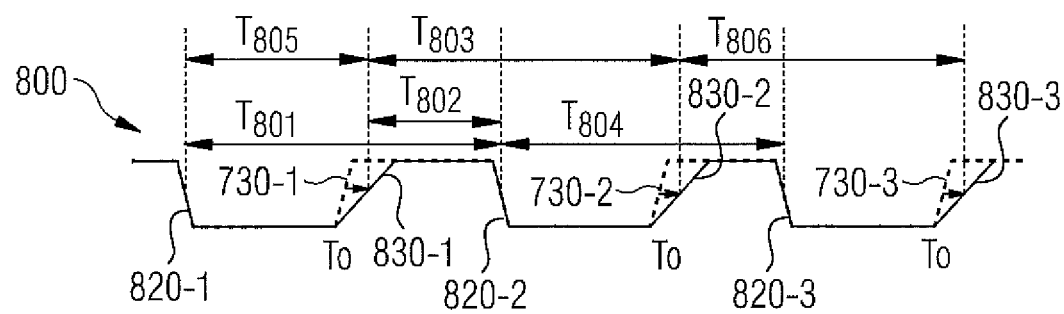
FIG. 8 illustrates another example of a sensor signal.

Similarly to the sensor signal 700, the sensor signal 800 illustrated in FIG. 8 comprises a first time interval $T_{801}$ between a between a first signal edge 820-1 of a first type and a second signal edge 820-2 of the first type. Further, the sensor signal 800 comprises a second time interval $T_{802}$ between a first signal edge 830-1 of the second type and the second signal edge 820-2 of the first type. The sensor signal 800 further comprises a third time interval $T_{803}$ between the first signal edge 830-1 of the second type and a second signal edge 830-2 of the second type. The sensor signal 800 also comprises a fourth time interval $T_{804}$ between the second signal edge 820-2 of the first type and a third signal edge 820-3 of the first type. The sensor signal 800 comprises a fifth time interval $T_{805}$ between the first signal edge 820-1 of the first type and the first signal edge 830-1 of the second type. Further, the sensor signal 800 comprises a sixth time interval $T_{806}$ between the second signal edge 830-2 of the second type and a third signal edge 830-3 of the second type.

As a reference, the first to third signal edges 730-1, 730-2 and 730-3 of the second type of the sensor signal 700 are illustrated in FIG. 8. It is evident from FIG. 8, that the fall times of the first to third signal edges 820-1, 820-2 and 820-3 of the first type are equal to the rise times of the first to third signal edges 730-1, 730-2 and 730-3 of the second type of the sensor signal 700, whereas the rise times of the first to third signal edges 820-1, 820-2 and 820-3 of the first type are different to the rise times of the first to third signal edges 830-1, 830-2 and 830-3 of the second type of the sensor signal 800. This may be caused by asymmetries in the pMOS and nMOS path of a sensor device's output driver that generates the sensor signal 800. The differing rise and fall times correspond to a time shift $T_d$ between the signal edges of the second type of the sensor signal 700 and the signal edges of the second type of the sensor signal 800.

However, since the above decoding scheme uses the time intervals between succeeding signal edges of the same type, the decoding scheme is insensitive to the differing rise and fall times of the signal edges.

As indicated in FIGS. 7 and 8, signal edges of the first type may be falling signal edges, and signal edges of the second type may be rising signal edges. However, in some examples, signal edges of the first type may alternatively be rising signal edges, while signal edges of the second type may be falling signal edges.

Figure 5:
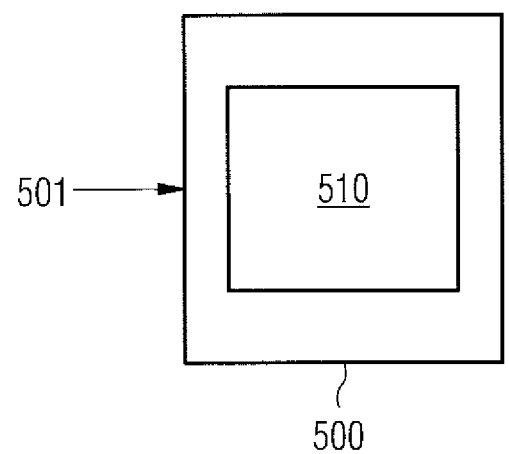
FIG. 5 illustrates another example of an apparatus for decoding a sensor signal.

Another apparatus 500 for decoding a sensor signal 501 that comprises sensor data is illustrated in FIG. 5. The apparatus 500 comprises a processing circuitry 510 configured to calculate a unit time based on a first time interval of the sensor signal 501 between a first signal edge of a first type and a first signal edge of a second type, a second time interval of the sensor signal 501 between the first signal edge of the second type and a second signal edge of the first type, and information about a first and a second reference value represented by the first and the second time interval. Further, the processing circuitry 510 is configured to calculate a compensation time based on a time difference between the first time interval and the second time interval, and a multiple of the unit time that is proportional to a difference between the first and the second reference value. The processing circuitry 510 is additionally configured to calculate a first data value based on the unit time, and a difference between the compensation time and a third time interval of the sensor signal 501 between the second signal edge of the first type and a second signal edge of the second type.

Also the apparatus 500 may allow to decode sensor signals of high data rate. Moreover, the apparatus 500 may be insensitive to asymmetries of a sensor device's output driver. For example, the apparatus may allow to correctly encode the sensor signal 501 if rise time and the fall time of the sensor signal 501 differ (e.g. signal edges of a first type and signal edges of a second type may have a different slope).

Figure 9:
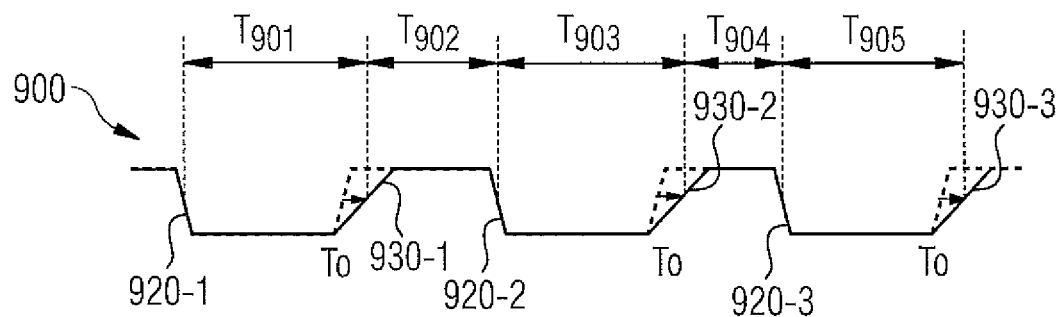
FIG. 9 illustrates a further example of a sensor signal.

Details of the decoding process that is executed by the processing circuitry 510 are described in the following with reference to FIG. 9. FIG. 9 illustrates a sensor signal 900 that may be decoded by the apparatus 500. In other words, sensor signal 900 may be an example for the sensor signal 501. For example, the sensor device 100 illustrated in FIG. 1, or the sensor device 200 illustrated in FIG. 2 may generate the sensor signal 900.

The sensor signal 900 comprises a first time interval $T_{901}$ between a first signal edge 920-1 of a first type (e.g. falling signal edge) and a first signal edge 930-1 of a second type (e.g. rising signal edge). Further, the sensor signal 900 comprises a second time interval $T_{902}$ between the first signal edge 930-1 of the second type and a second signal edge 920-2 of the first type. The sensor signal 900 also comprises a third time interval $T_{903}$ between the second signal edge 920-2 of the first type and a second signal edge 930-2 of the second type. Additionally, the sensor signal 900 comprises a fourth time interval $T_{904}$ between the second signal edge 930-2 of the second type and a third signal edge 920-3 of the first type. The sensor signal 900 further comprises a fifth time interval $T_{905}$ between the third signal edge 920-3 of the first type and a third signal edge 930-3 of the second type.

Like in sensor signals 700 and 800 illustrated in FIGS. 7 and 8, a first reference value $R_1$ and a second reference value $R_2$ are represented by the first time interval $T_{901}$ and the second time interval $T_{901}$.

The processing circuitry 510 is configured to calculate a unit time based on the first time interval $T_{901}$, the second time interval $T_{901}$, and information about the first and the second reference values $R_1$ and $R_2$.

The processing circuitry may, e.g., divide the sum of the first time interval $T_{901}$ and the second time interval $T_{901}$ by the sum of the first and the second reference values $R_1$ and $R_2$.

For example, the processing circuitry 510 may be configured to calculate the unit time based on an expression which is mathematically correspondent to with $T_U$ denoting the unit time.

$$T_U = \frac{T_{901} + T_{902}}{R_1 + R_2}, \quad (5)$$

Further, the processing circuitry 910 is configured to calculate a compensation time in order to compensate for different rise and fall times of the sensor signal 900 (indicated by the dashed signal edges of the second type). In other words, the compensation time indicates a relation of a slope of the signal edges of the first type to a slope of the signal edges of the second type. The compensation time is calculated based on a time difference between the first time interval $T_{901}$ and the second time interval $T_{901}$, and a multiple of the unit time $T_U$ that is proportional to a difference between the first and the second reference values $R_1$ and $R_2$.

For example, the processing circuitry 510 may be configured to calculate the compensation time based on an expression which is mathematically correspondent to $$T_d = \frac{(T_{901} - T_{902}) - (R_1 - R_2) \cdot T_U}{2}, \quad (6)$$

with $T_d$ denoting the compensation time.

The processing circuitry 510 is additionally configured to calculate a first data value based on the unit time $T_U$, and a difference between the compensation time $T_d$ and the third time interval $T_{903}$. The processing circuitry 510 may, e.g., be configured to calculate the first data value based on a ratio of the unit time $T_U$ to a difference between the third time interval $T_{903}$ and the compensation time $T_d$.

For example, the processing circuitry 510 may be configured to calculate the first data value based on an expression which is mathematically correspondent to $$D_1 = \frac{T_{903} - T_d}{T_U}, \quad (7)$$

with $D_1$ denoting the first data value.

The processing circuitry may be further configured to calculate a second data value based on the unit time $T_U$, and a difference between the compensation time $T_d$ and the fourth time interval $T_{904}$.

For example, the processing circuitry 510 may be configured to calculate the second data value based on an expression which is mathematically correspondent to $$D_2 = \frac{T_{904} - T_d}{T_U}, \quad (8)$$

with $D_2$ denoting the second data value.

Similarly, the processing circuitry 510 may be configured to calculate further data values of the sensor data based on a ratio of the unit time $T_U$ to a difference between the compensation time $T_d$ and a time interval representing the further data value.

For example, the processing circuitry 510 may be configured to calculate a third data value based on an expression which is mathematically correspondent to $$D_3 = \frac{T_{905} - T_d}{T_U}, \quad (9)$$

with $D_3$ denoting the third data value.

Since the above decoding scheme calculates the compensation time based on the time intervals representing the known reference values $R_1$ and $R_2$, the decoding scheme is insensitive to the differing rise and fall times of the signal edges.

As indicated in FIG. 9, signal edges of the first type may be falling signal edges, and signal edges of the second type may be rising signal edges. However, in some examples, signal edges of the first type may alternatively be rising signal edges, while signal edges of the second type may be falling signal edges.

Compared to the decoding scheme illustrated in connection with FIGS. 4, 7 and 8, FIGS. 5 and 9 may be understood as an alternative decoding approach, in which the pulse lengths are measured between each rising and falling edge. As indicated, the first two edges may be used to extract the difference between the length of a high and a low pulse. This may be subsequently used in order to correct the length of, e.g., data nibble pulse length measurements.

Figure 6:
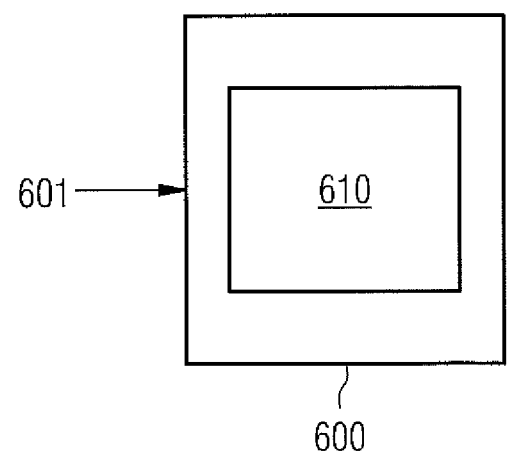
FIG. 6 illustrates a further example of an apparatus for decoding a sensor signal.

Still another apparatus 600 for decoding a sensor signal 601 that comprises sensor data is illustrated in FIG. 6. The apparatus 600 comprises processing circuitry 610 configured to calculate a first data value based on information about a reference value and a ratio of a unit time to a first time interval of the sensor signal 601 between a first signal edge of a first type and a second signal edge of the first type. The unit time is related to a time base of the apparatus 600. The reference value is represented by a leading time interval of the sensor signal 601 between the first signal edge of the first type and a first signal edge of a second type.

Also the apparatus 600 may allow to decode sensor signals of high data rate. Moreover, since the apparatus 600 uses its own time base for decoding the sensor signal 601, a data rate of the sensor signal 601 may be further increased since a reduced number of reference data is comprised by the sensor signal 601. The apparatus 600 may additionally be insensitive to asymmetries of a sensor device's output driver. For example, the apparatus may allow to correctly encode the sensor signal 601 if rise time and the fall time of the sensor signal 601 differ (e.g. signal edges of a first type and signal edges of a second type may have a different slope).

Figure 13:
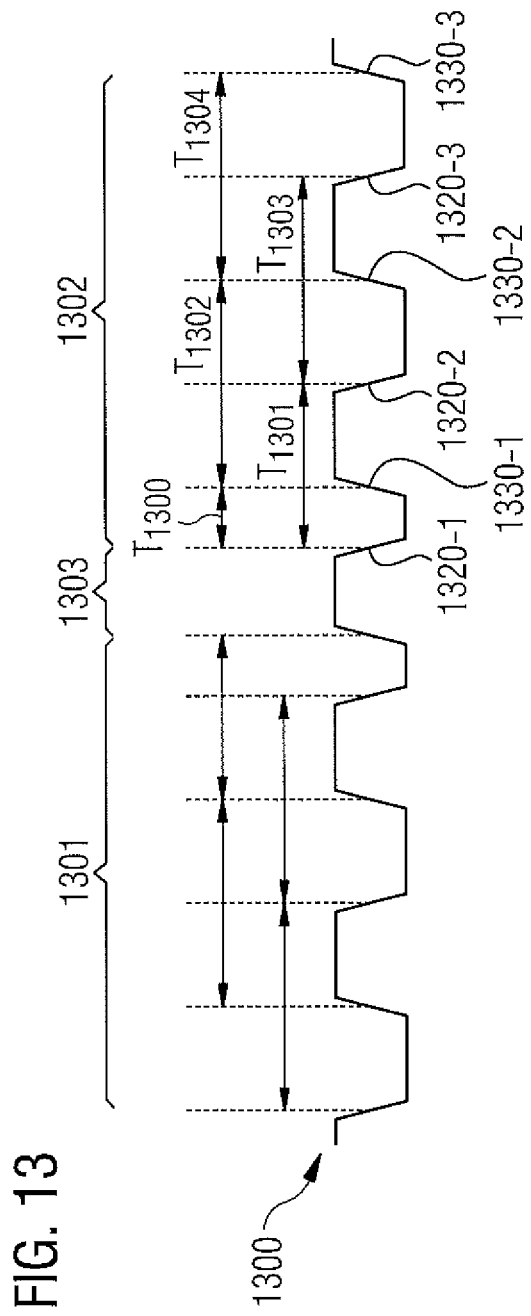
FIG. 13 illustrates a further example of a bus signal.

Details of the decoding process that is executed by the processing circuitry 610 are described in the following with reference to FIG. 13. FIG. 13 illustrates a bus signal 1300. The bus signal 1300 comprises a first part 1301 representing a control signal supplied to a sensor device, and a second part 1302 representing a sensor signal output by the sensor device. The first part 1301 and the second part 1302 are separated by a synchronization or pull-up time interval 1303.

The first part 1301 of the bus signal 1300 may, e.g., be supplied to the sensor device by an apparatus 300 for controlling a sensor device as illustrated in FIG. 3.

The second part 1302 of the bus signal 1300 may be decoded by the apparatus 600. In other words, the second part 1302 of the bus signal 1300 may be an example for the sensor signal 601. For example, the sensor device 200 illustrated in FIG. 2 may generate the second part 1302 of the bus signal 1300.

The second part 1302 of the bus signal 1300 comprises a leading time interval $T_{1300}$ between a first signal edge 1320-1 of a first type (e.g. falling signal edges) and a first signal edge 1330-1 of a second type (e.g. rising signal edges). Further, the second part 1302 of the bus signal 1300 comprises a first time interval $T_{1301}$ between the first signal edge 1320-1 of the first type and a second signal edge 1320-2 of the first type. The second part 1302 of the bus signal 1300 also comprises a second time interval $T_{1302}$ between the first signal edge 1330-1 of the second type and a second signal edge 1330-2 of the second type. Additionally, the second part 1302 of the bus signal 1300 comprises a third time interval $T_{1303}$ between the second signal edge 1320-2 of the first type and a third signal edge 1320-3 of the first type—The second part 1302 of the bus signal 1300 further comprises a fourth time interval $T_{1304}$ between the second signal edge 1330-2 of the second type and a third signal edge 1330-3 of the second type.

A reference value is represented by the leading time interval $T_{1300}$. For example, the reference value may represent a reference integer. Alternatively, the reference value may represent a control value in the first part 1301 of the bus signal 1300 (e.g. an address of the sensor, or a command for the sensor device). Further alternatively, the reference value may represent a checksum for the first part 1301 of the bus signal 1300. For example, the leading time interval $T_{1300}$ may be shorter than a shortest possible time interval for representing a data value (of the sensor data).

The apparatus 600 uses its own time base for decoding the second part 1302 of the bus signal 1300. That is, the apparatus 600 uses its own unit time for decoding the second part 1302 of the bus signal 1300.

For example, if the apparatus 600 and an apparatus for controlling the sensor device share the same time base (e.g. because a common ECU comprises both), the sensor device may decode the time base of the apparatus for controlling the sensor device in order to adjust its own time base to the timing of the apparatus for controlling the sensor device. Compared to the situation illustrated in FIGS. 7 and 8, one reference time pulse of the sensor device may be skipped and the second reference time pulse may be reduced to a short start pulse (e.g. including the known sensor address), which increases the available payload per time. Additionally, the apparatus 600 may use its own time base for receiving the sensor data. The start pulse (i.e. the leading time interval) may be shorter as the previously used reference times, since it is not needed for a precise measurement of the unit time any more. Additionally, a high security CRC (e.g. CRC8 or CRC16) may be used since errors may appear if the adjustment of the sensor time base was inaccurate.

The processing circuitry 610 is configured to calculate a first data value of the sensor data based on the information about the reference value R and a ratio of the unit time to the first time interval.

For example, the processing circuitry 610 may be configured to calculate the first data value based on an expression which is mathematically correspondent to $$D_1 = \frac{T_{1301}}{T_U} - R, \tag{10}$$

with $D_1$ denoting the first data value, $T_U$ denoting the unit time, and R denoting the reference value.

The processing circuitry 610 may, e.g., be configured to calculate a second data value based on information about the first data value $D_1$ and a ratio of the unit time $T_U$ to the second time interval $T_{1302}$.

For example, the processing circuitry 610 may be configured to calculate the second data value based on an expression which is mathematically correspondent to $$D_2 = \frac{T_{1302}}{T_U} - D_1, \tag{11}$$

with $D_2$ denoting the second data value.

Similarly, the processing circuitry 610 may be configured to calculate further data values of the sensor data based on information on an immediately preceding data value and a ratio of the unit time $T_U$ to a time interval representing the further data value and the immediately preceding data value.

The processing circuitry 610 may, e.g., be configured to calculate third data value based on information about the second data value $D_2$ and a ratio of the unit time to the third time interval $T_{1303}$.

For example, the processing circuitry 610 may be configured to calculate a third data value based on an expression which is mathematically correspondent to $$D_3 = \frac{T_{1303}}{T_U} - D_2, \tag{12}$$

with $D_3$ denoting the third data value.

Similarly, the processing circuitry 610 maybe configured to calculate fourth data value based on information about the third data value $D_3$ and a ratio of the unit time to the fourth time interval $T_{1304}$.

For example, the processing circuitry 610 may be configured to calculate the fourth data value based on an expression which is mathematically correspondent to $$D_4 = \frac{T_{1304}}{T_U} - D_3, \tag{13}$$

with $D_4$ denoting the fourth data value.

Since the above decoding scheme uses the time intervals between succeeding signal edges of the same type, the decoding scheme is insensitive to the differing rise and fall times of the signal edges similar to the decoding schemes described in connection with FIGS. 4, 7 and 8.

The individual apparatuses and sensor devices as described above may form a sensor system. For example, the sensor system may comprise one or more sensor devices as described, one or more apparatuses for controlling the sensor device as described above, and/or one or more apparatuses for decoding a sensor signal as described above.

Figure 10:
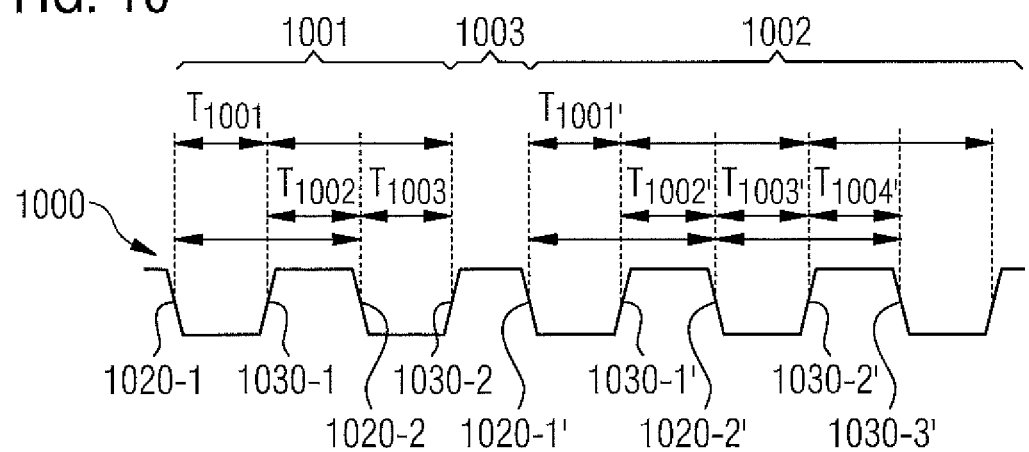
FIG. 10 illustrates an example of a bus signal.
Figure 11:
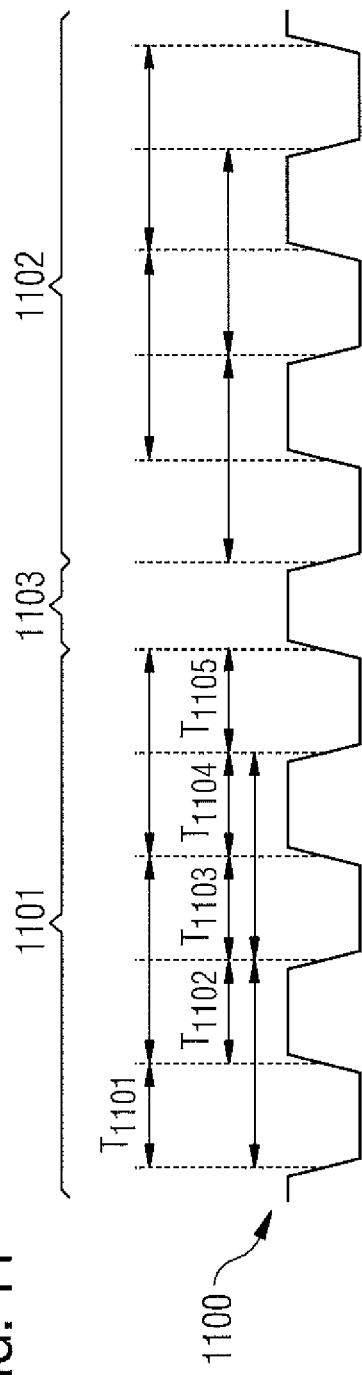
FIG. 11 illustrates another example of a bus signal.
Figure 12:
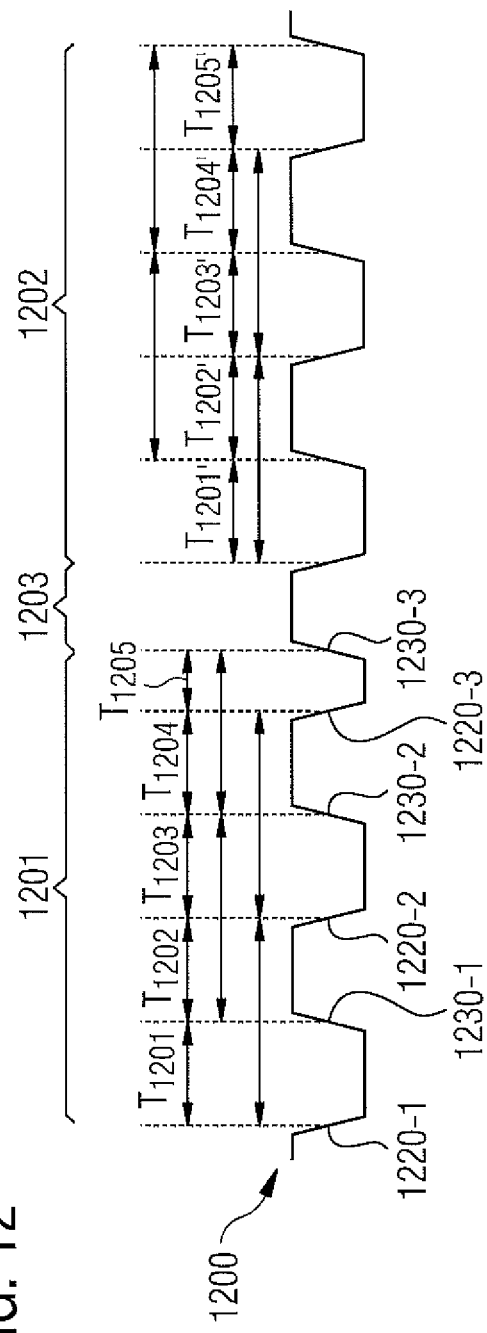
FIG. 12 illustrates still another example of a bus signal.

In the following a plurality of exemplary bus signals according to the present disclosure are described in connection with FIGS. 10 to 12. In FIGS. 10 to 12, a sensor device according to the present discloses communicates with an ECU comprising an apparatus for controlling the sensor device and an apparatus for decoding a sensor signal according to the present disclosure.

FIG. 10 illustrates a bus signal 1000. The bus signal 1000 comprises a first part 1001 representing a control signal supplied to the sensor device by the apparatus for controlling the sensor device, and a second part 1002 representing a sensor signal output by the sensor device. The first part 1001 and the second part 1002 are separated by a synchronization or pull-up time interval 1003.

A first time interval $T_{1001}$ of the first part 1001 between a first signal edge 1020-1 of a first type and a first signal edge 1030-1 of a second type is based on a first reference value. A second time interval $T_{1002}$ of the first part 1001 between the first signal edge 1030-1 of the second type and a second signal edge 1020-2 of the first type based on a second reference value. A third time interval $T_{1003}$ of the first part 1001 between the second signal edge 1020-2 of the first type and a second signal edge 1030-2 of the second type based on a first control value for the sensor device. That is, the time interval between the first signal edge 1020-1 of the first type and the second signal edge 1020-2 of the first type represents the first and second reference values. The time interval between the first signal edge 1030-1 of the second type and the second signal edge 1030-2 of the second type represents the second reference value and the control value for the sensor device.

The sensor device may, e.g., encode the first part 1001 of the bus signal 1000 based on the decoding scheme described in connection with FIGS. 4, 7 and 8. Based on the control value, the sensor device may adjust its operation (e.g. synchronize its data acquisition). Accordingly, the sensor device may generate the second part 1002 of the bus signal 1000 as its output. For example, the sensor device may generate the second part 1002 of the bus signal 1000 as described in connection with FIGS. 1 and 2.

That is, a first time interval $T_{1001'}$ of the second part 1002 between a first signal edge 1020-1' of a first type and a first signal edge 1030-1' of a second type is based on the first reference value. A second time interval $T_{1002'}$ of the second part 1002 between the first signal edge 1030-1' of the second type and a second signal edge 1020-2' of the first type is based on the second reference value. A third time interval $T_{1003'}$ of the second part 1002 between the second signal edge 1020-2' of the first type and a second signal edge 1030-2' of the second type is based on a first data value (of the sensor data). A fourth time interval $T_{1004'}$ of the second part 1002 between the second signal edge 1030-2' of the second type and a third signal edge 1020-3' of the first type is based on a second data value (of the sensor data). Further data values may be encoded by adjusting the length of time intervals between succeeding signal edges of the second part 1002 of the bus signal 1000. That is, the time interval between the first signal edge 1020-1' of the first type and the second signal edge 1020-2' of the first type represents the first and second reference values, the time interval between the first signal edge 1030-1' of the second type and the second signal edge 1030-2' of the second type represents the second reference value and the control value for the sensor device, etc.

The apparatus for decoding the sensor signal may, e.g., encode the second part 1002 of the bus signal 1000 based on the decoding scheme described in connection with FIGS. 4, 7 and 8.

It is evident from FIG. 10 that the master to sensor communication, and vice versa, may be done in the same manner with falling and rising edge data encoding.

Even if the data rate needs for communication of sensor data to the ECU may be much higher than for the communication from the ECU to the sensor, the four states that SPC offers for the addresses or commands may not be sufficient and a similar communication scheme may be used in the direction from the ECU towards the sensor as well. The ECU message may be shorter than the sensor message, e.g. 1 or 2 nibbles for bus addresses and commands. A version with one nibble is illustrated in FIG. 10, and a version with 3 nibbles is illustrated in FIG. 11.

Compared to the first part 1001 of the bus signal 1000 illustrated in FIG. 10, the first part 1101 of the bus signal 1100 illustrated in FIG. 11 comprises two additional time intervals $T_{1104}$ and $T_{1105}$. That is, the first part 1101 comprises the first and second time intervals $T_{1101}$ and $T_{1102}$ which represent the first and second reference values, and the third to fifth time intervals $T_{1103}$, $T_{1104}$ and $T_{1105}$ representing first to third control values. This may allow the apparatus for controlling the sensor device to supply two additional control values to the sensor device. The second part 1102 and the third part of the bus signal 1100 are equivalent to the second part 1002 and the third part 1003 of the bus signal 1000 illustrated in FIG. 10.

The synchronization time used by all sensors may, e.g., be synchronized to the first falling edge of the ECU pulse similar to the standard SPC protocol. However any other edge may be used as synchronization time marker. This may allow to reduce the latency time in case of long messages from the ECU.

Alternative to the definition of a fixed length of a transmission frame (e.g. comprising the first part 1101, the second part 1102 and the third part 1103 of the bus signal 1100), a termination pulse may be inserted to mark the end of the ECU transmission. The termination pulse may be shorter than the shortest allowed regular data pulse. This is illustrated in FIG. 12.

FIG. 12 illustrates another bus signal 1200. Again, the bus signal 1200 comprises a first part 1201 representing a control signal supplied to the sensor device by the apparatus for controlling the sensor device, and a second part 1202 representing a sensor signal output by the sensor device. The first part 1201 and the second part 1202 are separated by a synchronization or pull-up time interval 1203.

A first time interval $T_{1201}$ of the first part 1201 between a first signal edge 1220-1 of a first type and a first signal edge 1230-1 of a second type is based on a first reference value. A second time interval $T_{1202}$ of the first part 1201 between the first signal edge 1230-1 of the second type and a second signal edge 1220-2 of the first type is based on a second reference value. A third time interval $T_{1203}$ of the first part 1201 between the second signal edge 1220-2 of the first type and a second signal edge 1230-2 of the second type is based on a first control value for the sensor device. A fourth time interval $T_{1204}$ of the first part 1201 between the second signal edge 1230-2 of the second type and a third signal edge 1220-3 of the first type is based on a second control value for the sensor device. Additionally, the last time interval $T_{1205}$ of the first part 1201 between the third signal edge 1220-3 of the first type and a third signal edge 1230-3 of the second type is provided. The last time interval of the first part 1201 is shorter than a shortest possible time interval for representing a data value. That is, the last time interval $T_{1205}$ is short than the time intervals $T_{1201}$ to $T_{1204}$.

The time interval between the first signal edge 1220-1 of the first type and the second signal edge 1220-2 of the first type, hence, represents the first and second reference values. The time interval between the first signal edge 1230-1 of the second type and the second signal edge 1230-2 of the second type represents the second reference value and the first control value for the sensor device. Further, the time interval between the second signal edge 1220-2 of the first type and the third signal edge 1220-3 of the first type represents the first and second control values for the sensor device. The last time interval indicates the end of the control signal for the sensor device.

The sensor device may, e.g., encode the first part 1201 of the bus signal 1200 based on the decoding schemes described in connection with FIGS. 4 and 5. Based on the control values, the sensor device may adjust its operation (e.g. synchronize its data acquisition). Accordingly, the sensor device may generate the second part 1202 of the bus signal 1200 as its output. For example, the sensor device may generate the second part 1202 of the bus signal 1200 as described in connection with FIG. 2.

As already described in connection with FIG. 2, the sensor device may adjust the first and second time intervals $T_{1201'}$ and $T_{1202'}$ based on the decoded first and second control values instead of reference integer values.

Since the ECU is aware of the message that it has sent out, the sensor can decode the ECU message and re-encode the received data into its own sync pulse instead of the reference values. This may implement an additional safety mechanism, because it allows the ECU to prove if the message was correctly received by the sensor.

Moreover, if one of the control data is the sensor address, the responding sensor may repeat not the received address data but replace it by its fixed programmed own bus address. This may allow to prove, whether the responding sensor is really the one that was requested by the ECU. For the case that the ECU message is long, a CRC (e.g. CRC8) of the long message may be calculated and sent back to the ECU. The ECU may then compare the CRC calculated by the sensor with a CRC of the data that was sent out.

The remaining time intervals of the second part 1202 of the bus signal 1200 may be adjusted based on the sensor data. For example, the third time interval $T_{1203'}$ may represent a first data value, the fourth time interval $T_{1204'}$ may represent a second data value, and the fifth time interval $T_{1205'}$ may represent a third data value.

For example, the apparatus for decoding the sensor signal may decode the second part 1202 of the bus signal 1200 based on the decoding scheme described in connection with FIG. 4.

A termination pulse may also be used to terminate the sensor message. That is, the second part 1202 of the bus signal 1200 may end with a last time interval between the last signal edge of the first type and the last signal edge of the second type that is shorter than a shortest possible time interval for representing a data value of the sensor data within the second part 1202.

For example, a unit time may be calculated based on an expression which is mathematically correspondent to $$T_U = \frac{T_{1201'} + T_{1202'}}{C_1 + C_2}, \qquad (14)$$

with $T_U$ denoting the unit time, and $C_1$ and $C_2$ denoting the first and second control value for the sensor device.

The first data value may be calculated based on an expression which is mathematically correspondent to $$D_1 = \frac{T_{1202'} + T_{1203'}}{T_U} - C_2, \qquad (15)$$

with $D_1$ denoting the first data value.

The second data value may be calculated based on an expression which is mathematically correspondent to $$D_2 = \frac{T_{1203'} + T_{1204'}}{T_U} - D_1, \qquad (16)$$

with $D_2$ denoting the second data value.

The third data value may be calculated based on an expression which is mathematically correspondent to $$D_3 = \frac{T_{1204'} + T_{1205'}}{T_U} - D_2, \qquad (17)$$

with $D_3$ denoting the third data value.

In the following a plurality of methods for transmitting sensor data, controlling a sensor device and decoding a sensor signal in accordance with the present disclosure are presented.

Figure 14:
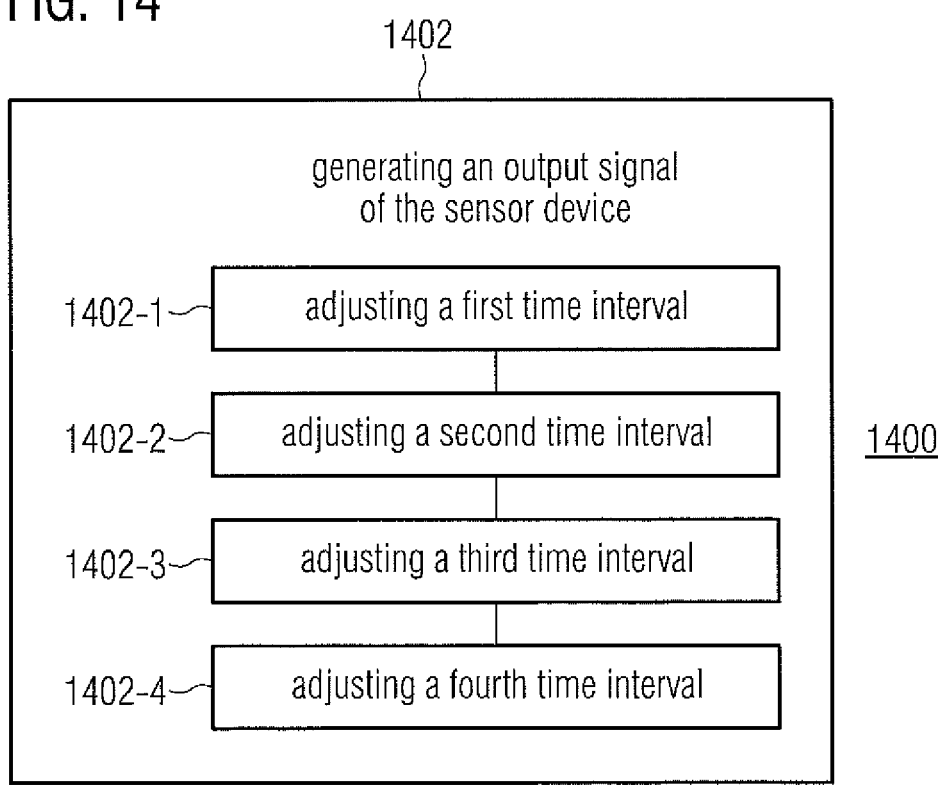
FIG. 14 illustrates a flowchart of an example of a method for transmitting sensor data of a sensor device.

An example of a method 1400 for transmitting sensor data of a sensor device is illustrated by means of a flowchart in FIG. 14. The method 1400 comprises generating 1402 an output signal of the sensor device. Generating 1402 the output signal of the sensor device comprises adjusting 1402-1 a first time interval of the output signal between a first signal edge of a first type and a first signal edge of a second type based on a first reference value. Further, generating 1402 the output signal of the sensor device comprises adjusting 1402-2 a second time interval of the output signal between the first signal edge of the second type and a second signal edge of the first type based on a second reference value. Generating 1402 the output signal of the sensor device additionally comprises adjusting 1402-3 a third time interval of the output signal between the second signal edge of the first type and a second signal edge of the second type based on a first data value. Further, generating 1402 the output signal of the sensor device comprises adjusting 1402-4 a fourth time interval of the output signal between the second signal edge of the second type and a third signal edge of the first type based on a second data value.

More details and aspects of the method are mentioned in connection with the proposed concept or one or more examples described above (e.g. FIG. 1). The method may comprise one or more additional optional features corresponding to one or more aspects of the proposed concept or one or more examples described above.

Figure 15:
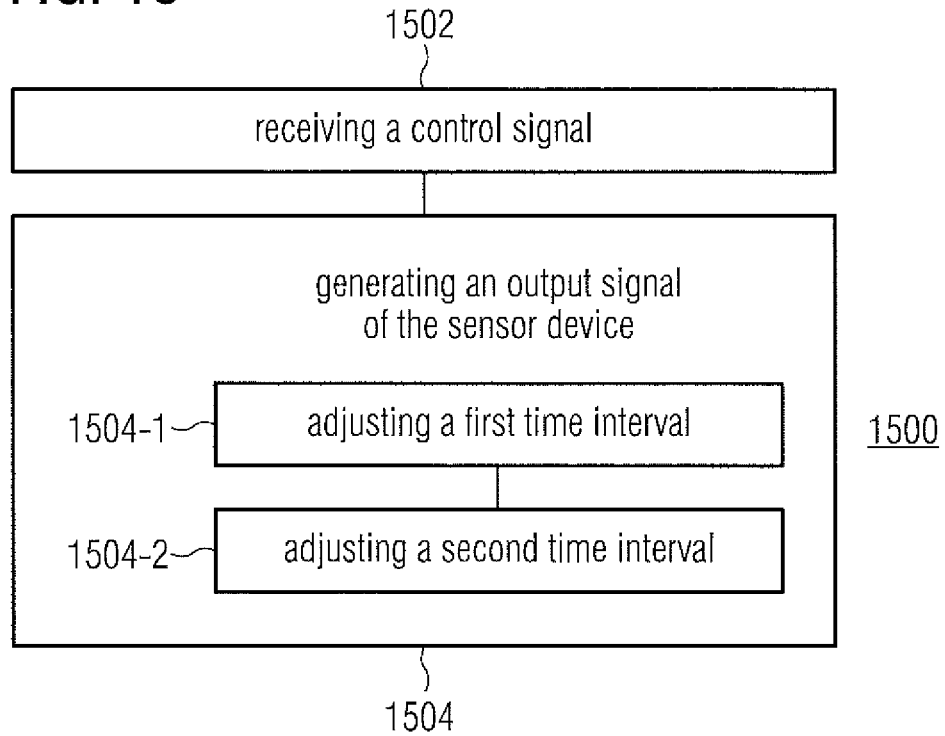
FIG. 15 illustrates a flowchart of another example of a method for transmitting sensor data of a sensor device.

An example of another method 1500 for transmitting sensor data of a sensor device is illustrated by means of a flowchart in FIG. 15. The method 1500 comprises receiving 1502 a control signal. Further the method 1500 comprises generating 1504 an output signal of the sensor device in response to the control signal. Generating 1504 the output signal of the sensor device comprises adjusting 1504-1 a first time interval of the output signal between a first signal edge of a first type and a first signal edge of a second type based on a first data value. Further, generating 1504 the output signal of the sensor device comprises adjusting 1504-2 a second time interval of the output signal between the first signal edge of the second type and a second signal edge of the first type based on a second data value.

More details and aspects of the method are mentioned in connection with the proposed concept or one or more examples described above (e.g. FIG. 2). The method may comprise one or more additional optional features corresponding to one or more aspects of the proposed concept or one or more examples described above.

Figure 16:
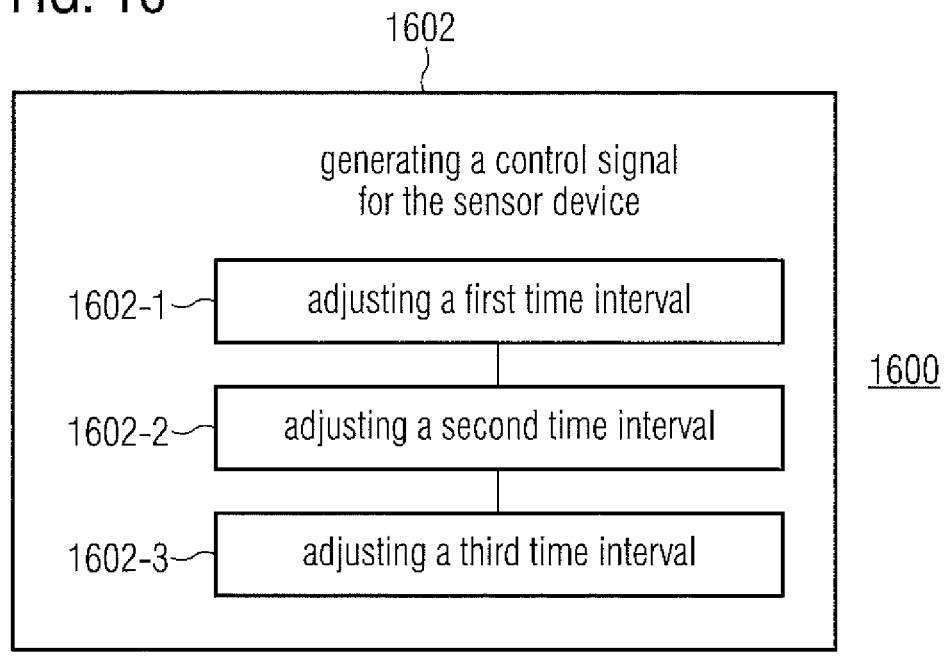
FIG. 16 illustrates a flowchart of an example of a method for controlling a sensor device.

An example of a method 1600 for controlling a sensor device is illustrated by means of a flowchart in FIG. 16. The method 1600 comprises generating 1602 a control signal for the sensor device. Generating 1602 the control signal for the sensor device comprises adjusting 1602-1 a first time interval of the control signal between a first signal edge of a first type and a first signal edge of a second type based on a first reference value. Further, generating 1602 the control signal for the sensor device comprises adjusting 1602-2 a second time interval of the control signal between the first signal edge of the second type and a second signal edge of the first type based on a second reference value. Generating 1602 the control signal for the sensor device additionally comprises adjusting 1602-3 a third time interval of the control signal between the second signal edge of the first type and a second signal edge of the second type based on a first control value.

More details and aspects of the method are mentioned in connection with the proposed concept or one or more examples described above (e.g. FIG. 3). The method may comprise one or more additional optional features corresponding to one or more aspects of the proposed concept or one or more examples described above.

Figure 17:
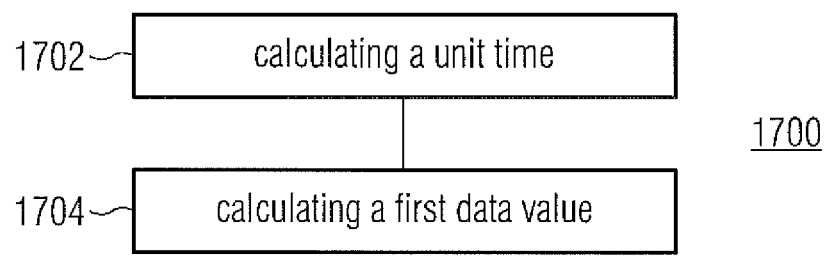
FIG. 17 illustrates a flowchart of an example of a method for decoding a sensor signal.

An example of a method 1700 for decoding a sensor signal that comprises sensor data is illustrated by means of a flowchart in FIG. 17. The method 1700 comprises calculating 1702 a unit time based on a first time interval of the sensor signal between a between a first signal edge of a first type and a second signal edge of the first type, and information about a first and a second reference value represented by the first time interval. Further, the method 1700 comprises calculating 1704 a first data value based on information about the second reference value and a ratio of the unit time to a third time interval of the sensor signal between a first signal edge of a second type and a second signal edge of the second type. The second reference value is represented by a second time interval of the sensor signal between a between the first signal edge of the second type and the second signal edge of the first type.

More details and aspects of the method are mentioned in connection with the proposed concept or one or more examples described above (e.g. FIGS. 4, 7 and 8). The method may comprise one or more additional optional features corresponding to one or more aspects of the proposed concept or one or more examples described above.

Figure 18:
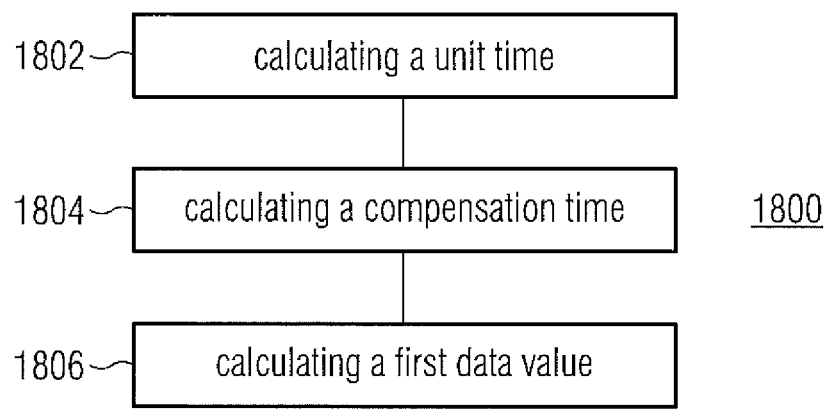
FIG. 18 illustrates flowchart of another example of a method for decoding a sensor signal.

An example of another method 1800 for decoding a sensor signal that comprises sensor data is illustrated by means of a flowchart in FIG. 18. The method 1800 comprises calculating 1802 a unit time based on a first time interval of the sensor signal between a first signal edge of a first type and a first signal edge of a second type, a second time interval of the sensor signal between a between the first signal edge of the second type and a second signal edge of the first type, and information about a first and a second reference value represented by the first and the second time interval. Further, the method 1800 comprises calculating 1804 a compensation time based on a time difference between the first time interval and the second time interval, and a multiple of the unit time that is proportional to a difference between the first and the second reference value. The method 1800 additionally comprises calculating 1806 a first data value based on the unit time, and a difference between the compensation time and a third time interval between the second signal edge of the first type and a second signal edge of the second type.

More details and aspects of the method are mentioned in connection with the proposed concept or one or more examples described above (e.g. FIGS. 5 and 9). The method may comprise one or more additional optional features corresponding to one or more aspects of the proposed concept or one or more examples described above.

Figure 19:
FIG. 19 illustrates a flowchart of a further example of a method for decoding a sensor signal.

An example of a further method 1900 for decoding a sensor signal that comprises sensor data is illustrated by means of a flowchart in FIG. 19. The method 1900 comprises calculating 1902 a first data value based on information about a reference value and a ratio of a unit time to a first time interval of the sensor signal between a first signal edge of a first type and a second signal edge of the first type. The unit time is related to a predefined time base. The reference value is represented by a leading time interval of the sensor signal between the first signal edge of the first type and a first signal edge of a second type.

More details and aspects of the method are mentioned in connection with the proposed concept or one or more examples described above (e.g. FIGS. 6 and 13). The method may comprise one or more additional optional features corresponding to one or more aspects of the proposed concept or one or more examples described above.

Apparatuses, devices and/or methods according to the present disclosure may serve a demand for higher communication speed without the need for more sophisticated physical implementations (e.g. additional wires or line termination).

Apparatuses, devices and/or methods according to the present disclosure may allow bidirectional communication in a double edge sensor communication protocol.

For example, encoding sensor messages using falling as well as rising edges of an SPC like/SENT like protocol may allow to approximately double the data rate per bandwidth.

The present disclosure may allow an extended command mode compared to the SPC protocol.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A sensor device for transmitting sensor data, the sensor device comprising:
    an output driver configured to generate an output signal of the sensor device, wherein the output driver is configured to:
        adjust a first time interval of the output signal between a first signal edge of a first type and a first signal edge of a second type based on a first reference value associated with a control signal received by the sensor device,
            wherein a length of the first time interval is represented by the first reference value;
        adjust a second time interval of the output signal between the first signal edge of the second type and a second signal edge of the first type based on a second reference value associated with the control signal,
            wherein a length of the second time interval is represented by the second reference value;
        adjust a third time interval of the output signal between the second signal edge of the first type and a second signal edge of the second type based on a first data value of the sensor data,
            wherein a length of the third time interval is represented by the first data value; and
        adjust a fourth time interval of the output signal between the second signal edge of the second type and a third signal edge of the first type based on a second data value of the sensor data,
            wherein a length of the fourth time interval is represented by the second data value.

2. The sensor device of claim 1, wherein signal edges of the first type are falling signal edges, and wherein signal edges of the second type are rising signal edges.

3. The sensor device of claim 1, wherein the output driver is a push-pull driver.

4. The sensor device of claim 1, wherein a last time interval of the output signal between a last signal edge of the first type and a last signal edge of the second type is shorter than a shortest possible time interval for representing a data value.

5. The sensor device of claim 1, wherein the sensor device is further configured to receive the control signal, and wherein the output driver is configured to generate the output signal based on the control signal.

6. A sensor device for transmitting sensor data, wherein the sensor device is configured to receive a control signal, wherein the sensor device comprises:

an output driver configured to generate an output signal of the sensor device based on the control signal, wherein the output driver is configured to:
adjust a first time interval of the output signal between a first signal edge of a first type and a first signal edge of a second type based on a first data value of the sensor data,
wherein a length of the first time interval is represented by the first data value;
adjust a second time interval of the output signal between the first signal edge of the second type and a second signal edge of the first type based on a second data value of the sensor data,
wherein a length of the second time interval is represented by the second data value;
adjust a third time interval of the output signal between a third signal edge of the first type and a second signal edge of the second type based on a first reference value,
wherein a length of the third time interval is represented by the first reference value; and
adjust a fourth time interval of the output signal between the second signal edge of the second type and the first signal edge of the first type based on a second reference value,
wherein a length of the fourth time interval is represented by the second reference value.

7. The sensor device of claim 6, wherein a processing circuitry of the sensor device is configured to calculate a time base for the sensor device based on the control signal, and wherein the output driver is configured to generate the output signal based on the time base.

8. The sensor device of claim 6, wherein the fourth time interval is a leading time interval, and
wherein the first time interval is succeeding the leading time interval.

9. The sensor device of claim 6, wherein a processing circuitry of the sensor device is configured to calculate a first control value for the sensor device and a second control value for the sensor device based on the control signal, and wherein the output driver is further configured to:
adjust the third time interval based on the first control value; and
adjust the fourth time interval based on the second control value.

10. The sensor device of claim 9, wherein, if one of the first control value or the second control value indicates an address of the sensor device, the output driver is configured to adjust a corresponding one of the third time interval or the fourth time interval based on the address of the sensor device that is hard-coded in the sensor device.

11. The sensor device of claim 6, wherein a last time interval of the output signal between a last signal edge of the first type and a last signal edge of the second type is shorter than a shortest possible time interval for representing a data value.

12. The sensor device of claim 6, wherein signal edges of the first type are falling signal edges, and wherein signal edges of the second type are rising signal edges.

13. The sensor device of claim 6, wherein the output driver is a push-pull driver.

14. The sensor device of claim 6, wherein the sensor device further comprises processing circuitry configured to calculate a checksum for the control signal, and wherein the output driver is further configured to adjust, based on the checksum, a time interval of the output signal between succeeding signal edges of different types.

15. An apparatus for controlling a sensor device, the apparatus comprising:
an output driver configured to generate a control signal for the sensor device, wherein the output driver is configured to:
adjust a first time interval of the control signal between a first signal edge of a first type and a first signal edge of a second type based on a first reference value,
wherein a length of the first time interval is represented by the first reference value;
adjust a second time interval of the control signal between the first signal edge of the second type and a second signal edge of the first type based on a second reference value,
wherein a length of the second time interval is represented by the second reference value; and
adjust a third time interval of the control signal between the second signal edge of the first type and a second signal edge of the second type based on a first control value,
wherein a length of the third time interval is represented by the first control value.

16. The apparatus of claim 15, wherein the output driver is further configured to adjust a fourth time interval of the control signal between the second signal edge of the second type and a third signal edge of the first type based on a second control value.

17. The apparatus of claim 15, wherein the output driver is further configured to adjust a last time interval of the control signal between a last signal edge of the first type and a last signal edge of the second type to be shorter than a shortest possible time interval for representing a control value.

18. A method, comprising:
adjusting, by an output driver of a sensor device, a first time interval of an output signal between a first signal edge of a first type and a first signal edge of a second type based on a first reference value associated with a control signal received by the sensor device,
wherein a length of the first time interval is represented by the first reference value;
adjusting, by the output driver, a second time interval of the output signal between the first signal edge of the second type and a second signal edge of the first type based on a second reference value associated with the control signal,
wherein a length of the second time interval is represented by the second reference value;
adjusting, by the output driver, a third time interval of the output signal between the second signal edge of the first type and a second signal edge of the second type based on a first data value of sensor data,
wherein a length of the third time interval is represented by the first data value; and
adjusting, by the output driver, a fourth time interval of the output signal between the second signal edge of the second type and a third signal edge of the first type based on a second data value of the sensor data,
wherein a length of the fourth time interval is represented by the second data value.

19. The method of claim 18, wherein signal edges of the first type are falling signal edges, and wherein signal edges of the second type are rising signal edges.

20. The method of claim 18, wherein a last time interval of the output signal between a last signal edge of the first type and a last signal edge of the second type is shorter than a shortest possible time interval for representing a data value.

21. A method, comprising:
adjusting, by an output driver of a sensor device, a first time interval of an output signal between a first signal edge of a first type and a first signal edge of a second type based on a first data value of sensor data,
wherein a length of the first time interval is represented by the first data value;
adjusting, by the output driver, a second time interval of the output signal between the first signal edge of the second type and a second signal edge of the first type based on a second data value of the sensor data,
wherein a length of the second time interval is represented by the second data value;
adjusting, by the output driver, a third time interval of the output signal between a third signal edge of the first type and a second signal edge of the second type based on a first reference value,
wherein a length of the third time interval is represented by the first reference value; and
adjusting, by the output driver, a fourth time interval of the output signal between the second signal edge of the second type and the first signal edge of the first type based on a second reference value,
wherein a length of the fourth time interval is represented by the second reference value.

22. The method of claim 21, further comprising:
calculating a time base for the sensor device based on a control signal received by the sensor device, and
generating the output signal based on the time base.

23. The method of claim 21, wherein the fourth time interval is a leading time interval, and
wherein the first time interval is succeeding the leading time interval.

24. A method, comprising:
adjusting, by a sensor device, a first time interval of a control signal between a first signal edge of a first type and a first signal edge of a second type based on a first reference value,
wherein a length of the first time interval is represented by the first reference value;
adjusting, by the sensor device, a second time interval of the control signal between the first signal edge of the second type and a second signal edge of the first type based on a second reference value,
wherein a length of the second time interval is represented by the second reference value; and
adjusting, by the sensor device, a third time interval of the control signal between the second signal edge of the first type and a second signal edge of the second type based on a first control value,
wherein a length of the third time interval is represented by the first control value.

25. The method of claim 24, further comprising:
adjusting a fourth time interval of the control signal between the second signal edge of the second type and a third signal edge of the first type based on a second control value.

* * * * *